United States Patent
Nicolet (10) Patent No.: US 8,256,605 B2
(45) Date of Patent: Sep. 4, 2012

(54) HOLDING MEANS, DEVICE AND METHOD FOR TRANSPORTING SUBSTRATES, IN PARTICULAR PRINTED CIRCUIT BOARDS

(75) Inventor: Laurent Nicolet, Moudon (CH)

(73) Assignee: Gebr. Schmid GmbH & co. (DE)

( * ) Notice: Subject to any disclaimer, the term of this patent is extended or adjusted under 35 U.S.C. 154(b) by 123 days.

(21) Appl. No.: 12/696,654

(22) Filed: Jan. 29, 2010

(65) Prior Publication Data

US 2010/0126829 A1    May 27, 2010

Related U.S. Application Data

(63) Continuation of application No. PCT/EP2008/005395, filed on Jul. 2, 2008.

(30) Foreign Application Priority Data

Jul. 30, 2007  (DE) .................. 10 2007 038 116

(51) Int. Cl.
*B65G 17/38*    (2006.01)
(52) U.S. Cl. ............... 198/470.1; 198/465.3; 198/803.2; 198/867.02; 198/867.05
(58) Field of Classification Search ............... 198/465.3, 198/803.2, 470.1, 867.02, 867.05–867.07
See application file for complete search history.

(56) References Cited

U.S. PATENT DOCUMENTS

| 3,070,216 | A | * | 12/1962 | Robson ..................... 198/803.2 |
| 4,462,588 | A | * | 7/1984 | Kogane .................... 271/265.03 |
| 4,494,456 | A | * | 1/1985 | Pink ............................... 101/35 |
| 4,954,069 | A | * | 9/1990 | Friedwald ..................... 425/453 |
| 5,145,055 | A | * | 9/1992 | Kondo ........................ 198/803.9 |
| 5,511,651 | A | * | 4/1996 | Barth ............................ 198/817 |
| 5,555,969 | A | * | 9/1996 | Yerly ......................... 198/803.3 |
| 5,873,452 | A | * | 2/1999 | Nolan ........................ 198/465.3 |
| 6,997,304 | B2 | * | 2/2006 | Thomas et al. ............ 198/465.3 |
| 7,954,631 | B1 | * | 6/2011 | Weaver et al. ................ 198/729 |

FOREIGN PATENT DOCUMENTS

| DE | 4337811 A1 | 5/1995 |
| DE | 19522733 A1 | 1/1997 |
| DE | 10131945 A1 | 1/2003 |
| DE | 10154884 A1 | 5/2003 |
| JP | 2002299406 A | 10/2002 |
| JP | 2006248651 A | 9/2006 |

* cited by examiner

*Primary Examiner* — Mark A Deuble
(74) *Attorney, Agent, or Firm* — Akerman Senterfitt (57) ABSTRACT

In order to transport printed circuit boards (30) through a processing system (12), printed circuit boards (30) lying one behind another can be connected by means of holding clips (22) to form a type of chain. The outer ends of the holding clips (22) are suspended on two spaced-apart transport chains (16) which provide for transport and mounting. The holding clips are formed in two parts with a lower holding part (22) and an upper holding part (40), between which a printed circuit board (30) is mounted.

21 Claims, 5 Drawing Sheets

HOLDING MEANS, DEVICE AND METHOD FOR TRANSPORTING SUBSTRATES, IN PARTICULAR PRINTED CIRCUIT BOARDS

FIELD OF APPLICATION AND PRIOR ART

The invention relates to holding means for holding or conveying thin, flat substrates, particularly printed circuit boards, which may be very thin. The invention also relates to a device having such holding means and to a method for conveying such substrates using such a conveying device.

When processing thin, flat substrates, such as for example printed circuit boards in the circuit board industry, particularly in the case of chemical etching processes, a treatment often takes place in a wet chemical process line. It is known to place the printed circuit boards on rollers or roller conveyors and to convey them through a treatment device. However, this is becoming increasingly difficult with ever thinner substrates, particularly printed circuit boards, which are already film-like. The substrates do not have an adequate inherent stability or as a result of their very limited weight can be moved or displaced on spraying with etching fluid or the like. In addition, the surfaces of some substrates are so sensitive that they could be damaged by the mere application to the rollers.

PROBLEM AND SOLUTION

The problem of the invention is to provide the aforementioned holding means, a device and the aforementioned method obviating the problems of the prior art and in particular permitting a good, reliable conveying of flat substrates, especially if they are thin or mechanically sensitive.

This problem is solved by holding means having the features of claim 1, a device having the features of claim 12 and a method having the features of claim 13 or 14. Advantageous and preferred developments of the invention form the subject matter of the further claims and are explained in greater detail hereinafter. Some features are described only for the device or for the method, but independently can apply to both the device and the method. By express reference the wording of the claims is made into part of the content of the description.

According to the invention holding means are provided and the device has holding means for a firm, particularly positive connection to a substrate. In the manner of holding or retaining clips, the inventive holding means project transversely to the conveying direction on one side and over and beyond the entire width of the substrates and are consequently wider than the substrates at least on one side. The inventive holding means are also constructed in such a way as to cooperate with a conveying device for conveying the substrates through a treatment device. This for example makes it possible to only fasten, suspend or hold the substrates on one or more of said holding means, so that there is no need for the aforementioned roller conveyors. The substrates can be essentially free in the air and are only held by the holding means. The inventive holding means or conveying device are advantageously constructed to move the substrates in a conveying device with a conveying plane corresponding to the substrate plane. The holding means can be flat or clip-like.

For a very good fastening or holding of the substrates it is possible for the holding means to project over the substrates on both sides. This makes it possible to hold or fasten the substrates over their entire width and so-to-speak somewhat clamp the same. In addition, the holding means projecting over both sides permit a two-sided fastening to the conveying device, which is very adequate.

In a further development of the invention such holding means are provided at the end of the substrates located both at the front and at the rear in the conveying direction. This not only permits an overall retention of the substrates, but also a clamping of the substrates in the longitudinal direction or conveying direction. However, account must be taken of the fact that such an arrangement clearly differs from a clamping of a substrate in an all-round frame, which may be self-supporting. According to the invention the stability of the arrangement or the holding of the substrates advantageously takes place in that the holding means are connected with or cooperate with the conveying device in a stable manner, so that the holding means can be given simpler construction.

According to a development of the invention the holding means have a two-part construction with a lower holding part and an upper holding part. The substrate is fastened between these two holding parts and for this purpose said holding parts have a specific construction. Numerous possibilities exist for this and some are described in exemplified manner hereinafter. Thus, the holding means can be constructed for a positive connection to the substrate or to one another in the case of multipart holding means. Thus, it is for example possible for a projection on the holding means to positively engage in a recess or opening in the substrate. Advantageously there are several such projections, the substrates preferably being pressed or held against the holding part, so that the projections do not slide out of the substrate. It is for example possible for the holding means to be in two parts or to have two holding parts, which for example clamp the substrate between them. The aforementioned projections can only be provided on a single holding part, for example the lower holding part. The projections can be pin-like and particular are slightly pointed in the upper area for an easier insertion into the corresponding recess. The projections on a holding part can engage through the substrate and project to such an extent on the other side that they engage in corresponding recesses in the other holding part and so enable the two holding parts to be positively connected, at least against movement in the conveying plane. Advantageously the projections extend transversely to the conveying plane.

If a holding means comprises two or optionally more holding parts, they should be held together during the passage of the substrate through the treatment device, at least against movements in the conveying or substrate plane.

In order to hold together holding means having several holding parts, a number of possibilities exist. One of these is a positive connection, particularly also in a direction at right angles to the substrate plane. This can be achieved by screwing or also by bayonet catches or the like.

Another possibility is provided by a non-positive holding together of the holding parts, a force closure in certain circumstances being easier to implement than the aforementioned positive connection. Thus, a force closure between two holding parts can take place through non-contact force means, such as negative pressure or vacuum or magnetic force. To this end it is for example possible to have movable or rotary magnets in both holding parts, which attract in a holding position and thereby hold together the two holding parts.

According to another inventive possibility at least one upper holding part is pivotably or movably mounted on the holding means or on the lower holding part and can be moved between an open position and a holding position. In a holding position the movable upper holding part, particularly in the vicinity of a marginal edge, is advantageously pressed against the lower holding part.

In a development of the invention the lower holding part and upper holding part can extend over most of the length of the substrate section projecting up to or fastened to the holding means. One holding part, advantageously the lower part, is somewhat longer than the ether.

Advantageously the at least one upper holding part is locked in a holding position with or against the lower holding part. Such a locking can either be in the form of a separate locking, for example by separately operated detents or the like. Advantageously the two holding parts are locked in self-locking manner in the holding position, for example by sliding the upper holding part with a bevel falling in the sliding direction under a corresponding bevel on the holding means or the lower holding part. With increasing insertion of the upper holding part there is an increase in the pressing action against the lower holding part or against an intermediate section of the substrate, so that the holding action is intensified.

In an advantageous development of the invention not only on the front and rear ends of a substrate are holding means provided, advent geously identical or similar holding means, but instead several substrates are successively interconnected by holding means in the manner of a chain. It can be advantageously provided that a holding means is constructed not only for holding a substrate, but instead two successive substrates. It is considered to be advantageous if the two substrates have a certain spacing, for example by at least a few millimetres to a few centimetres. In this way a longer chain of substrates can be created and is passed through the aforementioned treatment device. Said chain is solely clamped and moved by the connection of the holding means to a conveying device. The holding means can in each case be constructed for a similar connection to a front and a rear end of a substrate. With particular advantage in the case of a multipart holding means at least one lower holding part is so wide that both substrate ends are fastened to or rest on it. From above it is possible to apply either two separate narrow, upper holding parts or a single holding part with a similar width to the lower holding part.

In order to also avoid damage in the marginal area of the substrates through the holding means, soft contact areas in the form of rubber strips, rubber lips, etc. can be provided. In a further development of the invention they can even have a sealing action in such a way that an area around the recesses in the substrates through which projections of the holding parts engage are so sealed that treatment fluid or the like cannot pass from one side to the other in the treatment device. An area between two substrates can also be sealed in this way.

On an end laterally projecting over the substrate a holding means can be so constructed that it can be grippe or seized by the conveying device and for this purpose recesses or projections can be provided. With bilaterally projecting holding means the ends advantageously have an identical or similar construction.

The laterally projecting ends of the holding means can in a further development be angled or bent in such a way that they project upwards over the substrate or conveying plane. As a result the conveying direction or the fastening of the holding means to the conveying direction can be located above the substrate plane and therefore for example over a liquid level or the like in the treatment device so as to remain dry.

The conveying device can have for the purpose of conveying the substrates or gripping and moving the holding means with the substrates a belt or a corresponding chain, etc., which can rotate and move the holding means or substrates in the conveying direction. Preferably such belts or chains are located on both sides of the holding means or substrates. For fastening the holding means the belt or chain can have projections and/or recesses.

It is also possible for fastening to take place by force closure, for example a magnetic force. Preferably a fastening of the holding means to the conveying device, at least in the conveying direction, is so immovable that the holding means and consequently also the row of fixed together substrates can be quasi-clamped.

According to the invention, a cooperation of the substrates with the conveying device and the holding means can be such that two holding means are fastened with some space to the conveying device and substrate is fastened by its two ends to the holding means. With a two-part holding means this for example takes place by the application of the substrate to the lower holding part of the holding means. Then, if it is the first of many substrates, an upper holding part is placed on the first, lower holding part and consequently the fixing of the substrate to said holding means is completed.

Then, with a matching spacing, a further holding means is so fastened to the conveying device that a further substrate following on to the first substrate is then placed on the second holding means and the third holding means. Said connection is then completed with an upper holding part on the second holding means. Subsequently, once again with a substrate spacing, the next holding means is provided on the conveying device, followed by the application of a substrate and on the holding means at the front end of the last applied substrate an upper holding part is applied for completing the connection. This is continuously carried out in such a way that whenever a substrate is applied the two holding means are already present on which the substrate is placed with its ends.

These and further features can be gathered from the claims, description and drawings and the individual features, both singly and in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

Embodiments of the invention are described hereinafter relative to the attached diagrammatic drawings, wherein show.

DETAILED DESCRIPTION OF THE EMBODIMENTS

Figure 1:
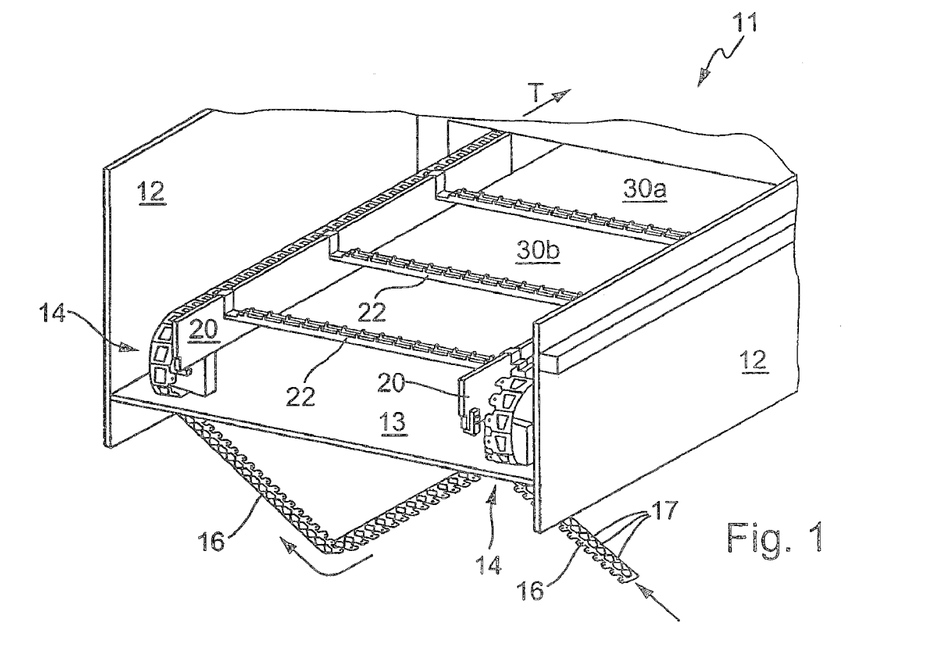
FIG. 1 An inclined view of an inventive conveying device with printed circuit boards fastened to the inventive holding means.

FIG. 1 shows a conveying device 11 with a treatment tank 12 formed by two side walls and with a bottom 13. Right and to the rear the conveying device 11 or treatment tank 12 runs in the conveying direction T into a not shown installation for the treatment of printed circuit boards, for example for an etching step. To the left outside and right outside of conveying device 11 or treatment tank 12 is in each case provided a conveying device 14 with in each case one rotary conveying chain 16. As is in particular clear from the larger scale view of FIG. 2, the conveying chain 16 comprise individual chain links 17, which at an end directed towards a central area of treatment tank 12 have a hole 18. With respect to the central area of treatment tank 12 the conveying chains 16 are shielded via inner walls 20. The inner walls 20 can in certain circumstances even extend up to the bottom 13 of treatment tank 12 and consequently form a type of inner basin. Alternatively and as shown they can merely serve to prevent splashing of the conveying chain 16 with treatment fluid or for other purposes.

As holding means holding clips 22 are hung in between the conveying chains 16 and are shown and explained in greater detail hereinafter relative to FIGS. 3 to 5. The holding clips 22 bridge the gap between the inner walls 20. At the inner end thereof they have bent holding sections 23, which are for example bent at right angles and upwards in flat steel-like manner from the holding clips 22, then outwards over the inner walls 20 and behind the same back with an intermediate step to a horizontal end 25. As shown, in the intermediate step can be located rollers 24 or the like, with which the holding section 23 and therefore holding clip 22 run on a rail 27 and are carried by the same. In place of the rollers 24 it is also possible to have plain bearings or the like made from a corresponding suitable material. Thus, the weight of the holding clip 22 rests on the rails 27.

The movement is ensured by a not shown projection projecting downwards from end 25 and which engages or is inserted in the hole 18 of the corresponding chain link 17. Thus, the conveying chains 16 need only be designed for the force for performing the conveying movement, whereas the weight of the holding clips 22, together with their load, is carried by rails 27. Obviously and in a slight variant, the conveying chains 16 additionally carry the weight of the holding clips 22, which are consequently supported on the chains 16 or chain links 17.

To the rear and right of FIG. 1 are shown two printed circuit boards 30a, 30b, which are already fastened to the holding dips 22 and can be introduced from the rear and right into a treatment installation by the conveying devices 14. The precise nature of the fastening is explained hereinafter.

Figure 3:
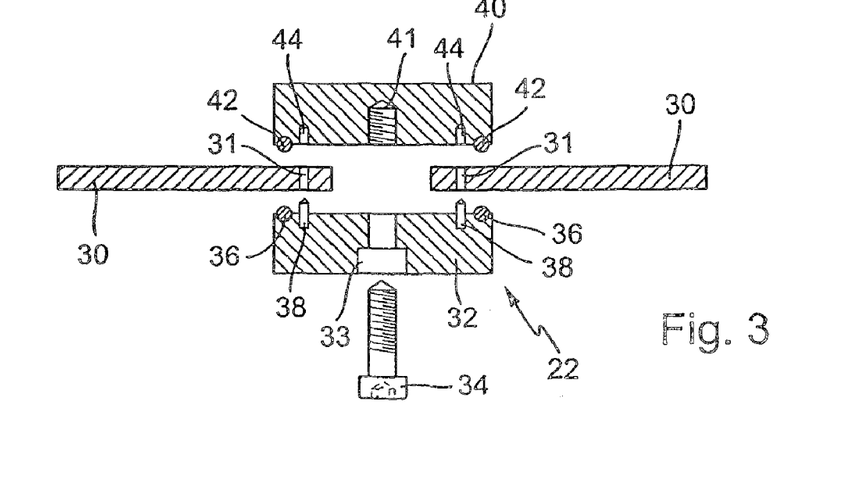
FIGS. 3 and 4 A diagrammatic side view of a structure of a two-part holding clip with screw coupling.

FIG. 3 in a side view shows a two-part holding clip 22, namely with a lower holding part 32 and an upper holding part 40. The lower holding part 32 has a screw hole 33 for the passage of a screw 34 moved up from the bottom. In the top side of the lower holding part 32 and to the far outside are introduced rubber lips 36 and pins 38, which are tapered at their top.

Figure 4:
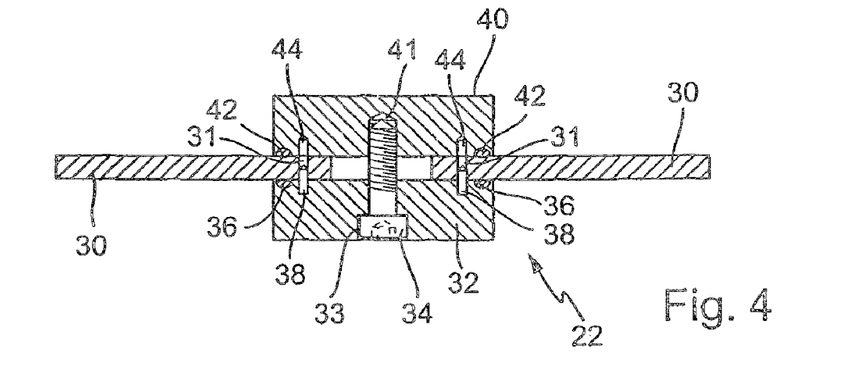

As can be seen, the printed circuit boards 30 have holes 31, which engage over the pins 38 on mounting, as shown in FIG. 4. Thus, on mounting on the lower holding part 32, the circuit board 30 is consequently non-positively connected thereto, at least in the plane thereof. As can be clearly gathered from FIG. 3, by means of the holding clip 22 two circuit boards 30 can be connected, in the manner of a chain.

So that the pins 38 cannot slide out of the holes 31 of the printed circuit boards 30 or the connection cannot be separated again, the upper holding part 40 is mounted from above on the lower holding part 32. The upper holding part 40 has a threaded hole 41 and rubber lips 42 and holes 44, which precisely face the rubber lips 36 and pins 38 of the lower holding part 32. FIG. 4 shows how by tightening screw 34 the two holding parts 32 and 40 can be tightened very extensively and in certain circumstances even completely against one another. The application of the circuit boards 30 can be but need not be limited to the rubber lips 36.

FIG. 4 shows that the pins 38 do not engage in the holes 44 of the upper holding part 40. However, this causes no problems, because the application of the circuit boards 30 to the lower holding part 32 is not impaired and a precise fitting mounting of the upper holding part 40 is necessary anyway.

Figure 2:
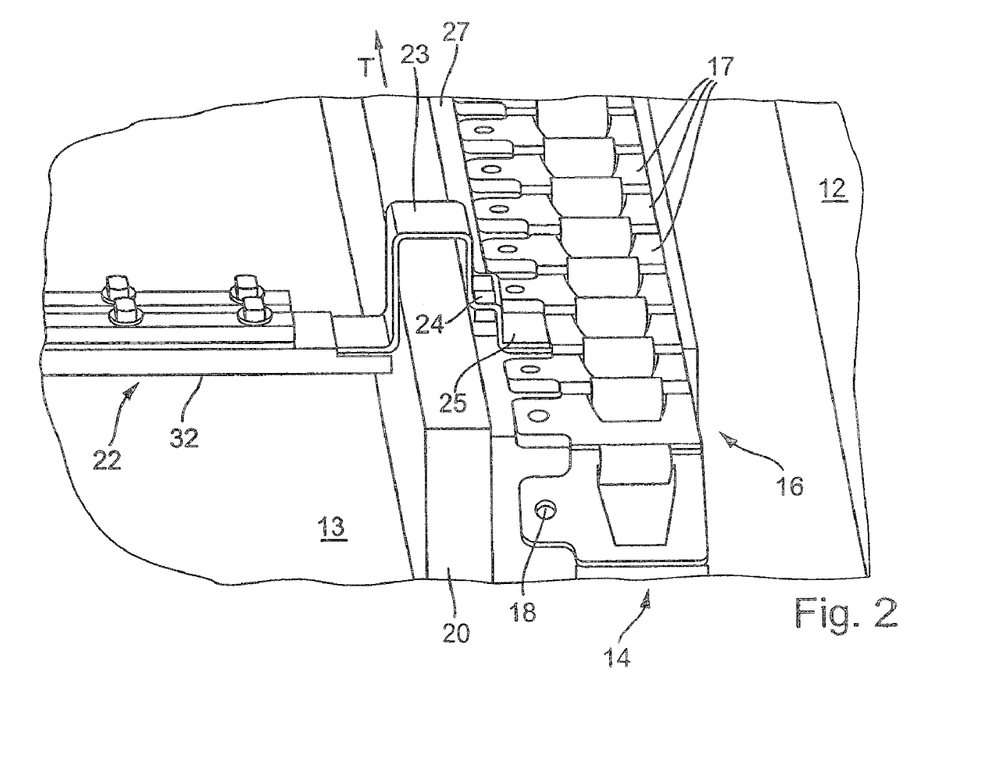
FIG. 2 A larger scale view of one end of a holding clip hung in a conveying chain of the conveying device.

Thus, FIGS. 3 and 4 show how for the fastening of the printed circuit board 30 to the holding clips 22 two-part holding clips with a lower holding part 32 and an upper holding part 40 can be provided. The comparison with FIGS. 1 and 2 shows that the lower holding parts 32 extend nearly up to the inner walls 20, whereas the upper holding parts 40 can be somewhat shorter, because their function is only to ensure the fixing or securing of the printed circuit boards 30 on the lower holding part 32 which actually constitutes the holding means. In a longitudinal extension of the holding clips 22 two screws 34 are sufficient for interconnecting sufficiently inherently stable holding parts in such a way as to reliably hold the circuit boards 30. Thus, the expenditure for finishing the connection can be decreased. It is obviously also possible for the screws 34 to engage from above in the holding clips 22. As an alternative to screws it is also possible to use mechanical fast closures, such as for example bayonet catches or the like. FIG. 4 also shows that on ensuring the sealing action of rubber lips 36 and 42 relative to printed circuit boards 30 and holding parts 32 and 40 a vacuum can be produced in the space between the ends of the circuit boards. In place of screws 34 it is then possible to provide suitable valves, which for example maintain a vacuum following its production in the gap for pressing application of the holding parts.

Figure 5:
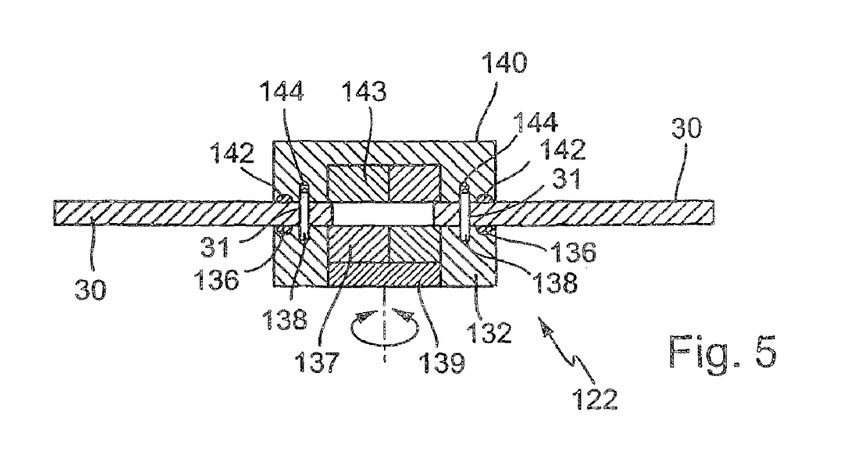
FIG. 5 An alternative construction of a two-part holding clip similar to FIG. 3 with a non-positive fastening by magnets.

FIG. 5 shows an alternative development of a holding clip 122, which once again comprises a lower holding part 132 and an upper holding part 140. The lower holding part 132 once again comprises pins 138 and rubber lips 136. The upper holding part 140 also has rubber lips 142 and holes 144 for the pins 138. However, the pins 138 are then so long that they project well above the height of the printed circuit boards 130, pass through the same and engage in the holes 144 of the upper holding part 140.

In place of a positive fastening of the two holding parts 32 and 40 to one another, as shown in FIG. 4, FIG. 5 shows a lower holding magnet 137 and an upper holding magnet 143. They are oppositely poled, so that they attract one another and consequently firmly connect the lower holding part 32 and upper holding part 140 by means of pins 138 in holes 144. For the easy release of the connection, the upper holding magnet 143 is firmly located in the upper holding part 140. The lower holding magnet 137 can be rotated about a rotation axis parallel to the pins 138, as illustrated by the rotation arrow. Gripping parts 139 are provided for this purpose and can be manually or preferably mechanically rotated. In yet a further development of the invention it is even possible for the magnetic or magnetizable portions of the holding parts to be in contact in the gap between the printed circuit boards 30, so that the magnetic force and the resulting holding force can be further increased. Much as described hereinbefore for screws, it is also possible in the case of fastening by magnetic force for the rotary magnet not to be provided in the lower holding part 122, but instead in the upper holding part 140 and can be reached from above.

Figure 6:
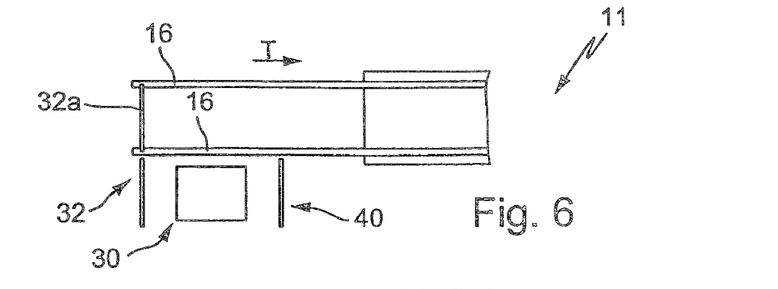
FIGS. 6 to 11 A method in a number of steps for illustrating the introduction of the printed circuit boards into the conveying device.

The individual steps of the inventive method for introducing the printed circuit boards 30 in the conveying device 11 are illustrated in FIGS. 6 to 11. FIG. 6 shows that a first, lower holding part 32a is placed on conveying chain 16, as is for example shown in FIG. 2.

Figure 7:
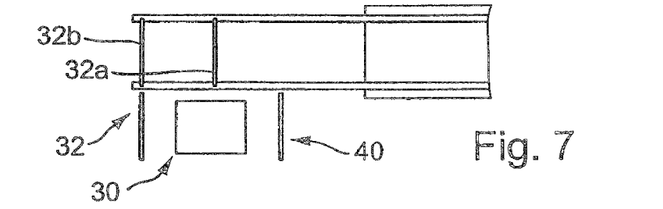

In FIG. 7, compared with FIG. 6, the conveying chains 16 have been moved somewhat in conveying direction T, so that the placed-on, lower holding part 32a is further to the right. With spacing of roughly a length of a printed circuit board, a second, lower holding part 32b is then placed on conveying chain 16.

Figure 8:
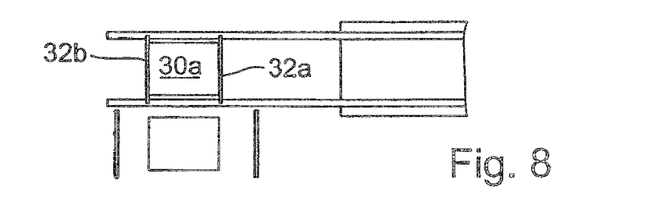

FIG. 8 shows how the conveying chains 16 are once again moved in conveying direction T and on the two lower holding parts 32a, 32b has been placed a printed circuit board 30a in accordance with FIGS. 3 to 5.

Figure 9:
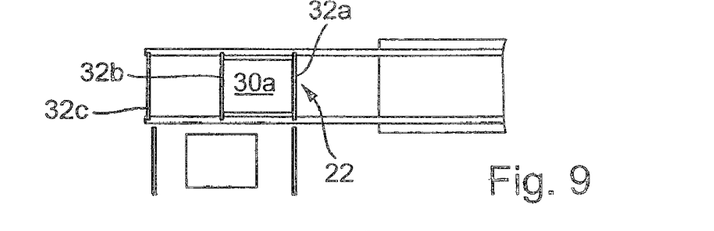

FIG. 9 shows how after further movement of printed circuit board 30 in conveying direction T, a third, lower holding part 32c has been placed on the conveying chain 16. Once again the spacing is such that a circuit board can be precisely placed thereon in the next step. Moreover, on the furthest forward, lower holding part 32a has been placed an upper holding part 40a in order to complete the connection, for example according to FIG. 4 or 5.

Figure 10:
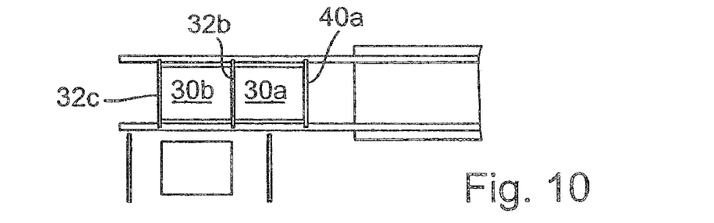

FIG. 10 shows how the conveying chains 16 have been again moved somewhat in conveying direction T and a further printed circuit board 30b has been appropriately placed on the second holding part 32b and third holding part 32c.

Figure 11:
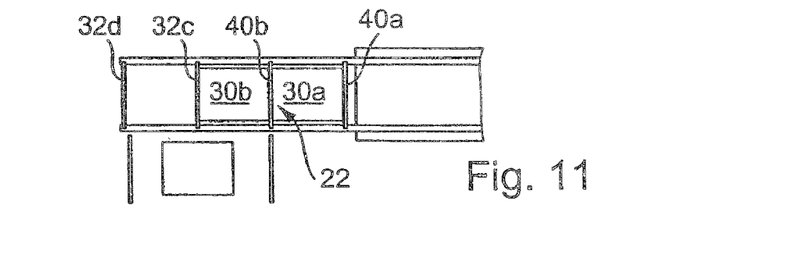

In the next step according to FIG. 11 the conveying chains 16 have again been moved on in conveying direction T and a further, lower holding part 32d has been placed thereon with the same spacing as the lower holding parts. On the second, lower holding part 32b, i.e. between the first circuit board 30a and the second circuit board 30b, a second, upper holding part 40b has been mounted for completing this connection.

This method is continued in the manner apparent from the described steps. In each case from the supplies of the lower holding parts 32, printed circuit boards 30 and upper holding parts 40 below the lower conveying chains 16, precisely at this point one is placed on or fastened to the conveying device 11. Thus, according to the invention it is possible to hold or clamp very thin or mechanically sensitive printed circuit boards 30 in such a way that they can be moved in problem-free manner by a conveying device 11 through a treatment tank 12 or a corresponding installation and a treatment can be carried out without damaging the circuit board, changing its orientation or causing other problems.

Figure 12:
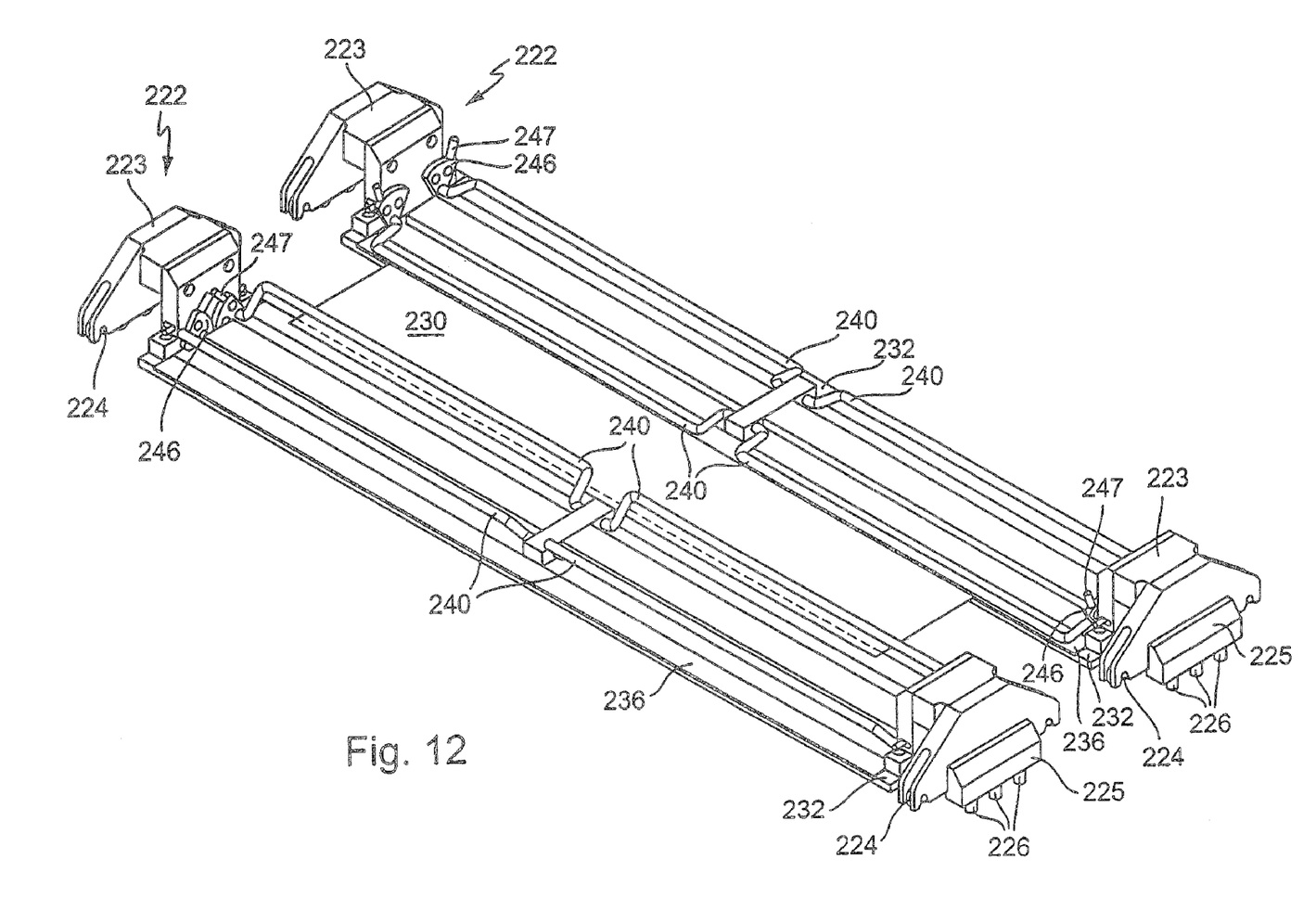
FIG. 12 An alternative construction of the inventive holding means with clamp fastening of printed circuit boards by rotary clips.

FIG. 12 shows two alternative holding clips 222 with the above-described, lower holding parts 232. At the ends on holding sections 223 they have rollers 224 in the manner of a sliding bearing. Laterally outside the sliding bearings for the rollers 224 the ends 225 are provided with downwardly projecting pins 226. The rollers 224 can then run along rail 27 corresponding to FIG. 2. The pins 226 engage in the holes 8 of chain 17 according to FIG. 2 for conveying purposes and as described hereinbefore.

Much as described hereinbefore, the lower holding parts 232 extend over the entire width of the conveying device 11 and are for example constructed in the manner of a flat support or a flat, but adequately stable, elongated plate. They advantageously, but not necessarily have a central longitudinal support in the manner of a reinforcing rib.

Upper holding parts 240 are mounted in the manner of rotary, continuous clips on the lower holding part 232, namely on outer pivot bearings 246 at the end close to the holding sections 223 and centrally between the same. On the outer pivot bearings 246 are provided upwardly directed control levers 247, which can be gripped mechanically or by hand for rotating the upper holding parts 240. On the left-hand holding clip 222 it is possible to see how the upper holding parts 240 are rotated upwards or into an open position by rotating the control levers 247 towards one another. This open position is also apparent from the fact that a printed circuit board 230 has been moved from the right up to the left-hand holding clip 222 and somewhat overlaps the lower holding part 232. It can be seen that over the entire width of the lower holding parts 232 rubber strips 236 are provided, which correspond to the above-described rubber lips 36, for example according to FIG. 3. These rubber strips 236 prevent a scratching of the printed circuit boards and in particular support a clamping fastening.

On the right-hand holding clip 222 it can be seen how the control levers 247, compared with the left-hand holding clip 222, were rotated away from one another. As a result the upper holding parts 240 are rotated and pressed at the edge against the lower holding part 232 or rubber strip 236. The left-hand, upper holding part 240 of the right-hand holding clip 222 clamps the circuit board 230 over virtually its entire width, namely by pressing against rubber strip 236 and therefore against the marginal portion of the lower holding part 232 and this constitutes the holding position. So that the upper holding parts 240 do not rotate back again and release the circuit board 230, on the pivot bearing 246 is provided a not shown locking means, for example in the manner of a pin or the like slid through from the rear, for example both in the open position and in the holding position. The control levers 247 at the outer end of holding clip 222 can also be locked against backward movement.

Thus, the device of FIG. 12 has holding clips 222, which are constructed as a subassembly and whose parts are undetachable, so that there is no longer a need for assembling several parts, as in the case of FIGS. 1 to 5. In addition, the upper holding parts 240 are movable in rotary manner with a pure rotary movement and are not self-locking in the holding position and which instead must be locked.

Figure 13:
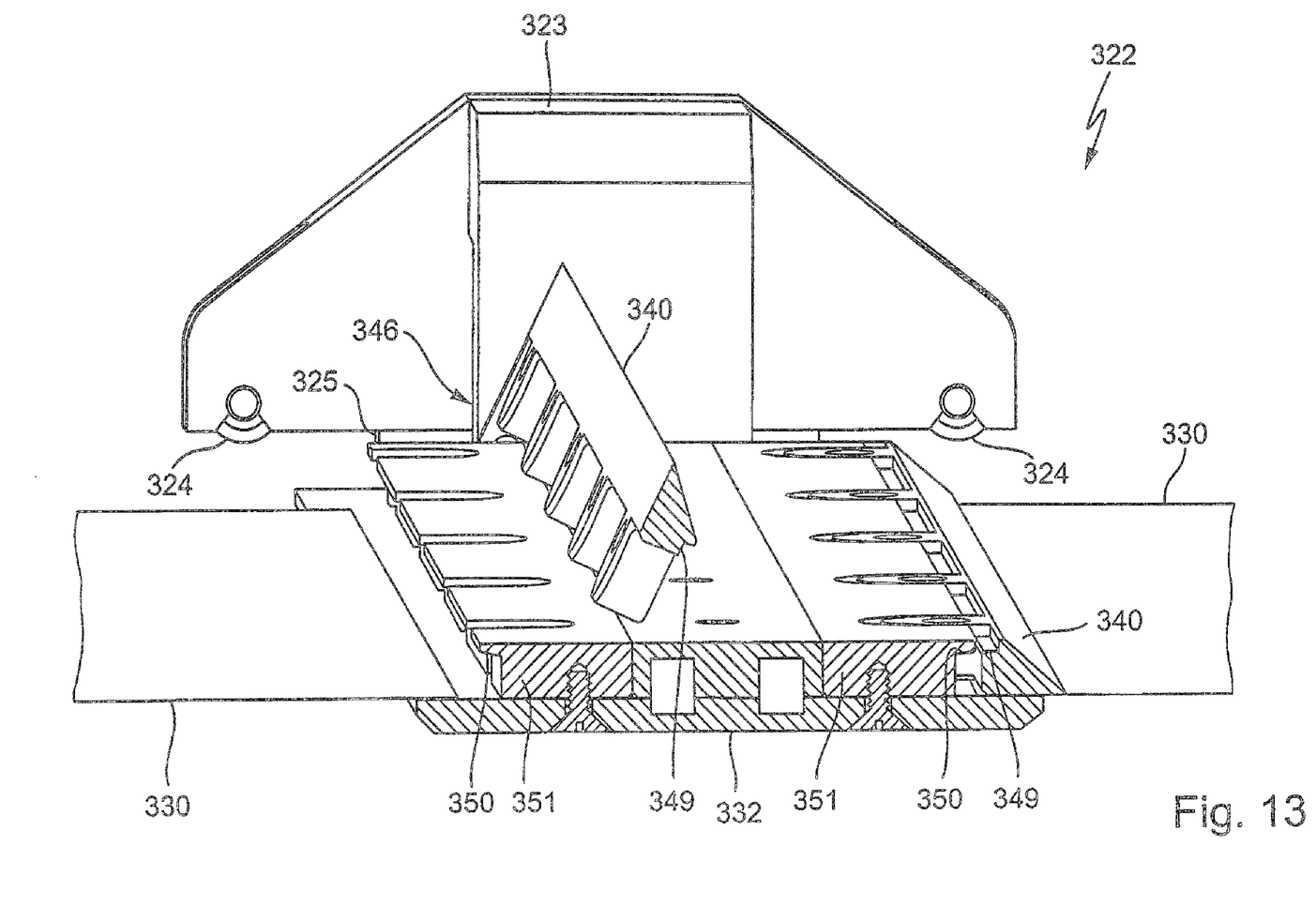
FIG. 13 Another alternative development of the inventive holding means with a self-locking clamping of the printed circuit boards.

FIG. 13 shows a further holding clip 322 with a lower holding part 332 and a holding section 323, rollers 324 and, corresponding to FIG. 12, not visible pins at one end 325 for fastening to a conveying chain 16 according to FIG. 2. Much as in the device according to FIG. 12, upper holding parts 340 are undetachably provided on the holding clip 322 and are in fact rotatably mounted on a pivot bearing 346. However, and as is easily conceivable, said pivot bearing 346 is not constructed exclusively as a rotary bearing and instead the upper part 340 to the left in FIG. 13 can be pivoted from the open position shown in counterclockwise direction until it rests on the lower holding part 332 or the left-hand circuit board 330 moved up to the same. Subsequently the upper holding part 340 can be slid with a clamping section 349 under a clamping overlap 350 of a guide 351 on the lower holding part 332 and can consequently be clamped in the manner of wedges.

The clamping section 349 and the clamping overlap 350 are inclined with respect to the plane of the lower holding part. The further the upper holding part 340 with the clamping section 349 is slid into guide 351 and under the clamping overlap 350, the greater the clamping action and as a result of the inclined plane the contact force or pressure with which the circuit board 330 is clamped or held between the upper holding part 340 and lower holding part 332 is also increased. To the right in FIG. 13 is shown how following the pure rotation of the upper holding part 340 sliding into guide 351 takes place for the above-described clamping of circuit board 330.

For said rotatability a stub shaft can be provided at the lower holding part 332 and engages in a slot in upper holding part 340. Thus, in said slot it can be both rotated and displaced. Such bearings are basically known to the person skilled in the art.

The advantage of the holding clip 322 according to FIG. 13 compared with those described hereinbefore is that it is a self-retaining or self-locking fastening. Following strong pressing of upper holding parts 340 into guides 351 fixing thereof has taken place and it cannot release itself, so that the circuit board 330 is also retained.

The above-described method for introducing holding means or holding clips with the printed circuit boards or for said circuit boards into the conveying device can take place in the same way with the holding clips according to FIGS. 12 and 13. Thus, the circuit boards can be successively mounted and consequently held. However, there is no extra moving up of the upper holding parts and instead downward rotation or pivoting takes place. Here again as an alternative a holding of the circuit boards on the holding means separately from the conveying device is possible.

The invention claimed is:

1. Holding means for a conveying device for conveying thin, flat substrates through a treatment device in a conveying direction, said holding means being constructed as holding clips for a fixed connection to one of said substrates,
   wherein said holding means, at least on one side, are elongate in a direction transverse to said conveying direction and project over a width of said substrates, and are constructed for cooperating with said conveying device for conveying said substrates through said treatment device,
   wherein said holding means are constructed in at least two-part manner with a lower holding part and an upper holding part, said holding parts being constructed for fastening one of said substrates between them, and
   wherein said lower holding part projects somewhat over said upper holding part.

2. The holding means according to claim 1, wherein said holding means are constructed for a positive connection to one of said substrates.

3. The holding means according to claim 1, wherein said holding means are constructed in the manner of elongated or flat holding clips and project on both sides over said substrates.

4. The holding means according to claim 1, wherein said holding means are constructed for a positive connection of at least one projection in a recess in said substrate.

5. The holding means according to claim 1, wherein said holding means can be gripped for conveying said substrates by ends projecting laterally over an extension of said substrates at right angles to said conveying direction.

6. The holding means according to claim 5, wherein said holding means have recesses or projections to be positively gripped, wherein said ends of said holding means are bent and said recesses or projections provided thereon are located somewhat over a conveying plane of said substrates.

7. A conveying device with said holding means according to claim 1, wherein said conveying device or said holding means have at least one revolving belt partly running in said substrate conveying direction or have a corresponding chain with projections or recesses for fastening said holding means thereto.

8. The conveying device according to claim 7, wherein said belts or said chains are provided to the left and right of a conveying path for said substrates.

9. Holding means for a conveying device for conveying thin, flat substrates through a treatment device in a conveying direction, said holding means being constructed as holding clips for a fixed connection to one of said substrates,
   wherein said holding means, at least on one side, are elongate in a direction transverse to said conveying direction and project over a width of said substrates, and are constructed for cooperating with said conveying device for conveying said substrates through said treatment device,
   wherein said holding means are constructed for a positive connection of at least one projection in a recess in said substrate,
   wherein said holding means have two holding parts and said holding parts clamp said substrates between them, and
   wherein said projections are provided on one of said holding parts.

10. The holding means according to claim 9, wherein at least one of said holding parts has pin-like projections for engaging into one of said substrates, wherein said pin-like projections extend through said substrate and project from the substrate in such a way that they engage in corresponding recesses in said other holding part.

11. Holding means for a conveying device for conveying thin, flat substrates through a treatment device in a conveying direction, said holding means being constructed as holding clips for a fixed connection to one of said substrates,
    wherein said holding means, at least on one side, are elongate in a direction transverse to said conveying direction and project over a width of said substrates, and are constructed for cooperating with said conveying device for conveying said substrates through said treatment device,
    wherein said holding means are constructed in at least two-part manner with a lower holding part and an upper holding part, said holding parts being constructed for fastening one of said substrates between them, and
    wherein there is a force closure between said two holding parts by non-contact force means.

12. Holding means for a conveying device for conveying thin, flat substrates through a treatment device in a conveying direction, said holding means being constructed as holding clips for a fixed connection to one of said substrates,
    wherein said holding means, at least on one side, are elongate in a direction transverse to said conveying direction and project over a width of said substrates, and are constructed for cooperating with said conveying device for conveying said substrates through said treatment device, and
    wherein said holding means have an upper holding part and a lower part, and are constructed for connecting or mechanically coupling together two of said successive substrates for an identical connection.

13. The holding means according to claim 12, wherein said lower holding part is constructed for engaging two of said substrates on in each case opposite longitudinal sides of said lower holding part.

14. The holding means according to claim 12, wherein at least one said upper holding part is movably or pivotably mounted on said holding means or on said lower holding part between an open position and a holding position and wherein in said holding position, said movable, upper holding part is pressed against said lower holding part and is locked in a holding position on said lower holding part.

15. The holding means according to claim 14, wherein said at least one upper holding part is provided with a bevel and is locked in said holding position by sliding said upper holding part in a sliding direction under a corresponding bevel on said holding means or on said lower holding part, wherein with increasing insertion of said upper holding part, a pressing of said upper holding part against said lower holding part and against an intermediate portion of said substrate increases.

16. Holding means for a conveying device for conveying thin, flat substrates through a treatment device in a conveying direction, said holding means being constructed as holding clips for a fixed connection to one of said substrates, wherein said holding means, at least on one side, are elongate in a direction transverse to said conveying direction and project over a width of said substrates, and are constructed for cooperating with said conveying device for conveying said substrates through said treatment device, wherein said holding means are constructed in at least two-part manner with a lower holding part and an upper holding part, said holding parts being constructed for fastening one of said substrates between them, and wherein said holding means are sealed against said engaging or fastened substrates by seals located on said holding means such that both said holding parts are largely sealed against said substrates and a gap between the holding parts is substantially fluid-free.

17. A method for holding thin, flat substrates with holding means for a conveying device for conveying thin, flat substrates through a treatment device in a conveying direction, said holding means being constructed as holding clips for a fixed connection to one of said substrates, wherein said holding means, at least on one side, are elongate in a direction transverse to said conveying direction and project over a width of said substrates, and are constructed for cooperating with said conveying device for conveying said substrates through said treatment device, the method comprising the steps of:

providing at least a first and a second holding means on said conveying device with a mutual spacing therebetween;

placing one of said substrates on the conveying device such that end regions of said substrate rest on a lower holding part of said first holding means and on a lower holding part of said second holding means;

providing a further holding means on said conveying device with a mutual spacing between said second and said further holding means; and subsequently placing a further substrate on the conveying device such that end regions of said substrate rest on said lower holding part of said second holding means and on a lower holding part of said further holding means, wherein subsequently a mechanical holding of said substrates on said holding means takes place to prevent an automatic release of said substrates from said holding means.

18. The method according to claim 17, wherein said end regions of said substrates are mounted on said lower parts of said holding means and are connected with upper parts of said holding means, at least in a non-positive manner.

19. The method according to claim 18, wherein said upper and lower holding parts, during a passage of said substrate, are undetachably held together in a plane of said substrate.

20. The method according to claim 18, wherein during said passage of said substrate, said upper holding part and said lower holding part are non-positively held together.

21. The method according to claim 20, wherein said upper holding part holds projections of said lower holding part in recesses of said substrate by pressing said substrate against said lower holding part.

* * * * *